(12) United States Patent
Jung et al.

(10) Patent No.: US 10,615,129 B2
(45) Date of Patent: Apr. 7, 2020

(54) SEMICONDUCTOR PACKAGE HAVING AN ELECTRO-MAGNETIC INTERFERENCE SHIELDING OR ELECTRO-MAGNETIC WAVE SCATTERING STRUCTURE

(71) Applicant: SK hynix Inc., Icheon-si, Gyeonggi-do (KR)

(72) Inventors: Won Duck Jung, Icheon-si (KR); Sang Joon Lim, Icheon-si (KR); Sung Mook Lim, Paju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/186,305

(22) Filed: Nov. 9, 2018

(65) Prior Publication Data
US 2019/0081009 A1 Mar. 14, 2019

Related U.S. Application Data

(62) Division of application No. 15/856,695, filed on Dec. 28, 2017, now Pat. No. 10,157,858.

(30) Foreign Application Priority Data

Feb. 24, 2017 (KR) .................. 10-2017-0024540

(51) Int. Cl.
*H01L 23/552* (2006.01)
*H01L 23/00* (2006.01)
(Continued)

(52) U.S. Cl.
CPC ........ *H01L 23/552* (2013.01); *H01L 23/4824* (2013.01); *H01L 23/49822* (2013.01);
(Continued)

(58) Field of Classification Search
CPC ......... H01L 2224/131; H01L 2924/181; H01L 2924/00012; H01L 2924/00014; H01L 2924/014; H01L 2224/0401; H01L 2224/06136; H01L 2224/1308; H01L 2224/13147; H01L 2224/14136; H01L 2224/16225; H01L 2224/16227; H01L 2224/1751; H01L 23/3128; H01L 23/4824; H01L 23/49811; H01L 23/49822; H01L 23/49827; H01L 23/49838; H01L 23/552; H01L 24/02; H01L 24/10; H01L 24/13; H01L 24/14; H01L 24/16; H01L 24/17;
(Continued)

(56) References Cited

U.S. PATENT DOCUMENTS

| 5,656,856 A * | 8/1997 | Kweon ............... H01L 25/105 257/686 |
| 6,201,298 B1 * | 3/2001 | Sato ............... H01L 23/49816 257/668 |

(Continued)

*Primary Examiner* — Mohammed Shamsuzzaman
(74) *Attorney, Agent, or Firm* — William Park & Associates Ltd.

(57) ABSTRACT

Disclosed is a semiconductor package. The semiconductor package may include a substrate a semiconductor chip mounted over a surface of the substrate such that an active surface of the semiconductor chip faces the surface of the substrate. The semiconductor chip and substrate may be configured for shielding or scattering electromagnetic waves.

9 Claims, 11 Drawing Sheets

(51) Int. Cl.
*H01L 23/482* (2006.01)
*H01L 23/498* (2006.01)
*H01L 23/31* (2006.01)

(52) U.S. Cl.
CPC .. *H01L 23/49827* (2013.01); *H01L 23/49838* (2013.01); *H01L 24/02* (2013.01); *H01L 24/10* (2013.01); *H01L 24/14* (2013.01); *H01L 24/17* (2013.01); *H01L 23/3128* (2013.01); *H01L 23/49811* (2013.01); *H01L 24/13* (2013.01); *H01L 24/16* (2013.01); *H01L 2224/0401* (2013.01); *H01L 2224/06136* (2013.01); *H01L 2224/131* (2013.01); *H01L 2224/1308* (2013.01); *H01L 2224/13147* (2013.01); *H01L 2224/14136* (2013.01); *H01L 2224/16225* (2013.01); *H01L 2224/16227* (2013.01); *H01L 2224/1751* (2013.01); *H01L 2924/15173* (2013.01); *H01L 2924/15174* (2013.01); *H01L 2924/15192* (2013.01); *H01L 2924/15311* (2013.01); *H01L 2924/181* (2013.01); *H01L 2924/3025* (2013.01)

(58) Field of Classification Search
CPC . H01L 2924/15173; H01L 2924/15174; H01L 2924/15192; H01L 2924/15311; H01L 2924/3025
See application file for complete search history.

(56) References Cited

U.S. PATENT DOCUMENTS

| | | | |
|---|---|---|---|
| 6,323,065 B1 * | 11/2001 | Karnezos | H01L 23/3128 257/E23.101 |
| 8,405,231 B2 * | 3/2013 | Hayashi | H01L 23/49838 257/786 |
| 8,513,813 B2 * | 8/2013 | Crisp | G11C 5/04 257/773 |
| 8,963,299 B2 * | 2/2015 | Lin | H01L 23/552 257/659 |
| 9,236,356 B2 * | 1/2016 | Yang | H01L 23/60 |
| 9,406,658 B2 * | 8/2016 | Lee | H01L 25/16 |
| 9,420,704 B2 * | 8/2016 | Morris | H01L 23/49827 |
| 9,748,179 B2 * | 8/2017 | Yoo | H01L 23/552 |
| 9,788,466 B2 * | 10/2017 | Chen | H04B 1/3838 |
| 9,807,890 B2 * | 10/2017 | Dang | H05K 1/144 |
| 9,826,630 B2 * | 11/2017 | Vincent | H05K 3/0073 |
| 9,842,809 B2 * | 12/2017 | Moon, III | H01L 23/552 |
| 2002/0070400 A1 * | 6/2002 | Shibuya | H01L 23/49822 257/296 |
| 2003/0171011 A1 * | 9/2003 | Li | H01R 31/08 439/68 |
| 2006/0044735 A1 * | 3/2006 | Hayashi | H01L 23/49816 361/313 |
| 2007/0040735 A1 * | 2/2007 | Matsuo | H01L 23/552 342/175 |
| 2007/0120245 A1 * | 5/2007 | Yoshikawa | H01L 23/49838 257/691 |
| 2007/0164429 A1 * | 7/2007 | Lee | H01L 23/49822 257/734 |
| 2007/0267725 A1 * | 11/2007 | Lee | H01L 23/481 257/659 |
| 2009/0127674 A1 * | 5/2009 | Suzuki | H01L 23/04 257/659 |
| 2010/0207258 A1 | 8/2010 | Eun et al. | |
| 2013/0319731 A1 | 12/2013 | Lee | |
| 2017/0278830 A1 * | 9/2017 | Kim | H01L 23/3736 |

\* cited by examiner

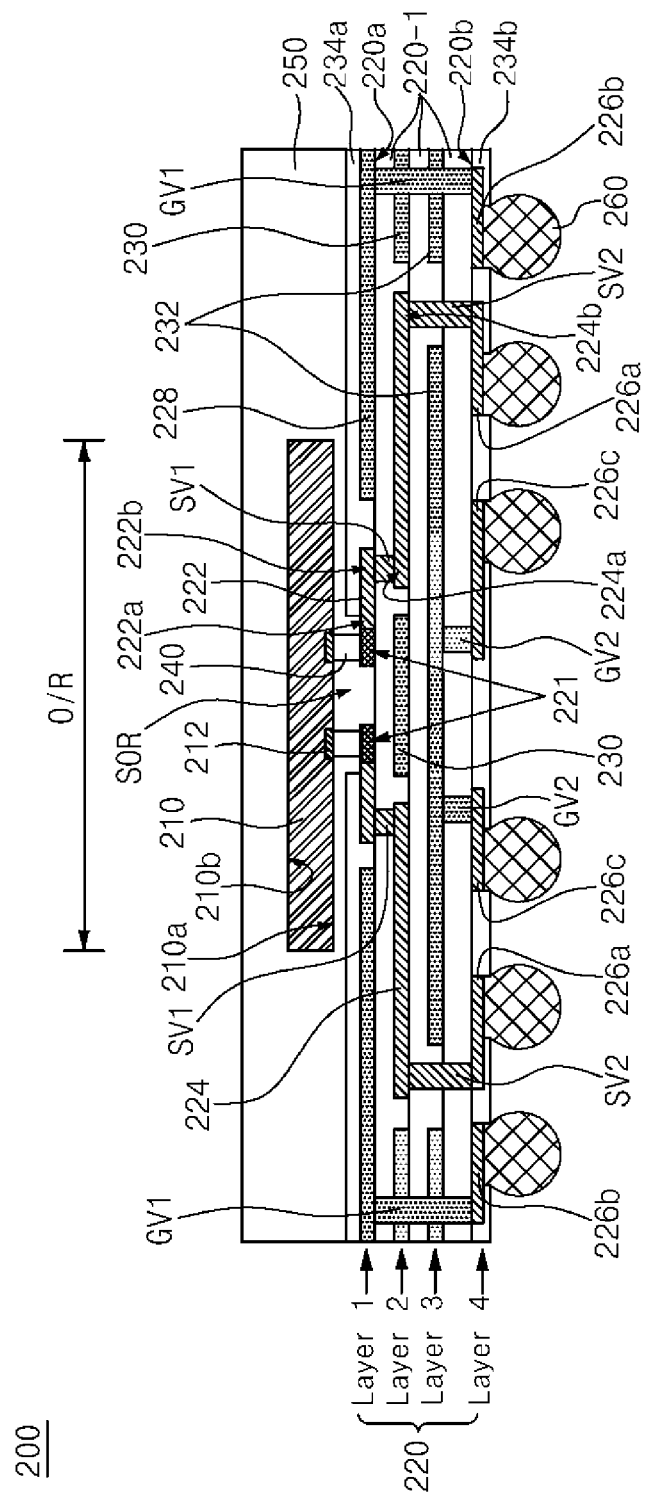

SEMICONDUCTOR PACKAGE HAVING AN ELECTRO-MAGNETIC INTERFERENCE SHIELDING OR ELECTRO-MAGNETIC WAVE SCATTERING STRUCTURE

CROSS-REFERENCE TO RELATED APPLICATION

The present application is a divisional application for U.S. patent application Ser. No. 15/856,695, filed on Dec. 28, 2017, and claims priority to Korean patent application number 10-2017-0024540 filed on Feb. 24, 2017, in the Korean Intellectual Property Office, which is incorporated herein by reference in its entirety.

BACKGROUND

1. Technical Field

Examples of embodiments of the present disclosure may generally relate to a semiconductor package, and more particularly, to a semiconductor package relating to shielding electromagnetic waves.

2. Related Art

When an electronic device on which a semiconductor package has been mounted operates, electromagnetic waves are inevitably generated by the electronic device. The generated electromagnetic waves are transferred to an external device through radiation. Interference caused by these electromagnetic field, i.e. electromagnetic interference (hereinafter referred to as ' EMI'), will cause the malfunction of external devices.

Recently, as the electronic devices are reduced in weight and size and become thinner and shorter, many EMI-related issues are generated because the interval between semiconductors is reduced and the operating speeds are increasing.

Accordingly, shielding internally generated electromagnetic waves is becoming an important issue of an electronic device.

SUMMARY

In an embodiment, a semiconductor package may include a substrate having a bond finger disposed over a top surface of the substrate. The semiconductor package may include a semiconductor chip mounted over the top surface of the substrate such that an active surface of the semiconductor chip faces the top surface of the substrate. The semiconductor chip may include a bonding pad disposed over the active surface and electrically coupled to the bond finger. The substrate may include an external signal line disposed over the top surface of the substrate and having a first one end coupled to the bond finger. The substrate may include a first ground pattern disposed over the top surface of the substrate and extended from an overlap region where the semiconductor chip overlaps with the substrate to the edge of the substrate. The substrate may include an internal signal line formed within the substrate and electrically coupled to the external signal line. The bond finger may be disposed to overlap the semiconductor chip. The internal signal line may be extended from the overlap region to an outside of the overlap region. The first ground pattern may be disposed to overlap the internal signal line extended to the outside of the overlap region.

In an embodiment, a semiconductor package may include a substrate having a bond finger, an external signal line, a ground bond finger and a first ground pattern formed over a top surface of the substrate, having an internal signal line electrically coupled to the external signal line disposed within the substrate, and having first to third external electrodes and disposed over a bottom surface of the substrate. The bond finger and the external signal line may be coupled together and the ground bond finger and the first ground pattern may be coupled together. The semiconductor package may include a semiconductor chip having an active surface mounted over the top surface of the substrate to face the top surface of the substrate. The semiconductor chip may include a bonding pad electrically coupled to the bond finger, a ground bonding pad electrically coupled to the ground bond finger, and a ground metal pattern coupled to the ground bonding pad, which are disposed over the active surface. The bond finger and the ground bond finger may be disposed to overlap the semiconductor chip. The external signal line may have a first one end coupled to the bond finger and may be disposed such that the entire external signal line overlap the semiconductor chip. The internal signal line may be disposed in an overlap region where the semiconductor chip overlaps with the substrate, and an outside of the overlap region. The first ground pattern may be disposed to overlap the internal signal line disposed the outside of the overlap region.

In an embodiment, a semiconductor package may include may include a substrate having a bond finger and a ground bond finger disposed over a top surface of the substrate. The semiconductor package may include a semiconductor chip mounted over the top surface of the substrate such that an active surface of the semiconductor chip faces the top surface of the substrate. The semiconductor chip may include may include a bonding pad disposed over the active surface and electrically coupled to the bond finger. The semiconductor chip may include may include a ground bonding pad electrically coupled to the ground bond finger. The semiconductor chip may include may include a ground metal pattern to which the ground bonding pad is coupled. The substrate may include an external signal line disposed over the top surface of the substrate and having one end coupled to the bond finger. The substrate may include a ground pattern disposed over the top surface of the substrate, extended from an overlap region where the semiconductor chip overlap with the substrate to the edge of the substrate, and to which the ground bond finger is coupled. The substrate may include a signal via formed within the substrate and electrically coupled to the external signal line. The substrate may include a ground via formed within the substrate and electrically coupled to the ground pattern. The substrate may include a first external electrode disposed over a bottom surface of the substrate and electrically coupled to the signal via. The substrate may include a second external electrode electrically coupled to the ground via. The bond finger may be disposed to overlap the semiconductor chip.

BRIEF DESCRIPTION OF THE DRAWINGS

FIGS. 2A and 2B are cross-sectional views of a semiconductor package taken along line A-A' and line B-B' of FIGS. 2C, 3A, 3B and 3C in accordance with an embodiment.

DETAILED DESCRIPTION

Figure 1A:
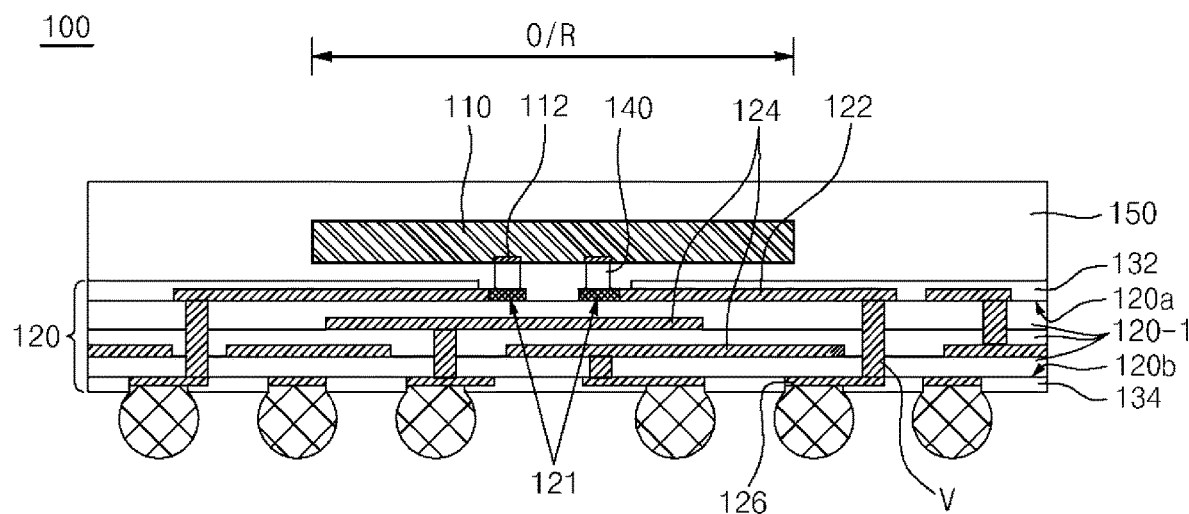
FIG. 1A is a cross-sectional view illustrating a conventional flip-chip package.

Various embodiments will be described below with reference to the accompanying drawings. The embodiments may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

An embodiment of the present disclosure provides a semiconductor package capable of shielding electromagnetic waves generated therein.

Figure 1B:
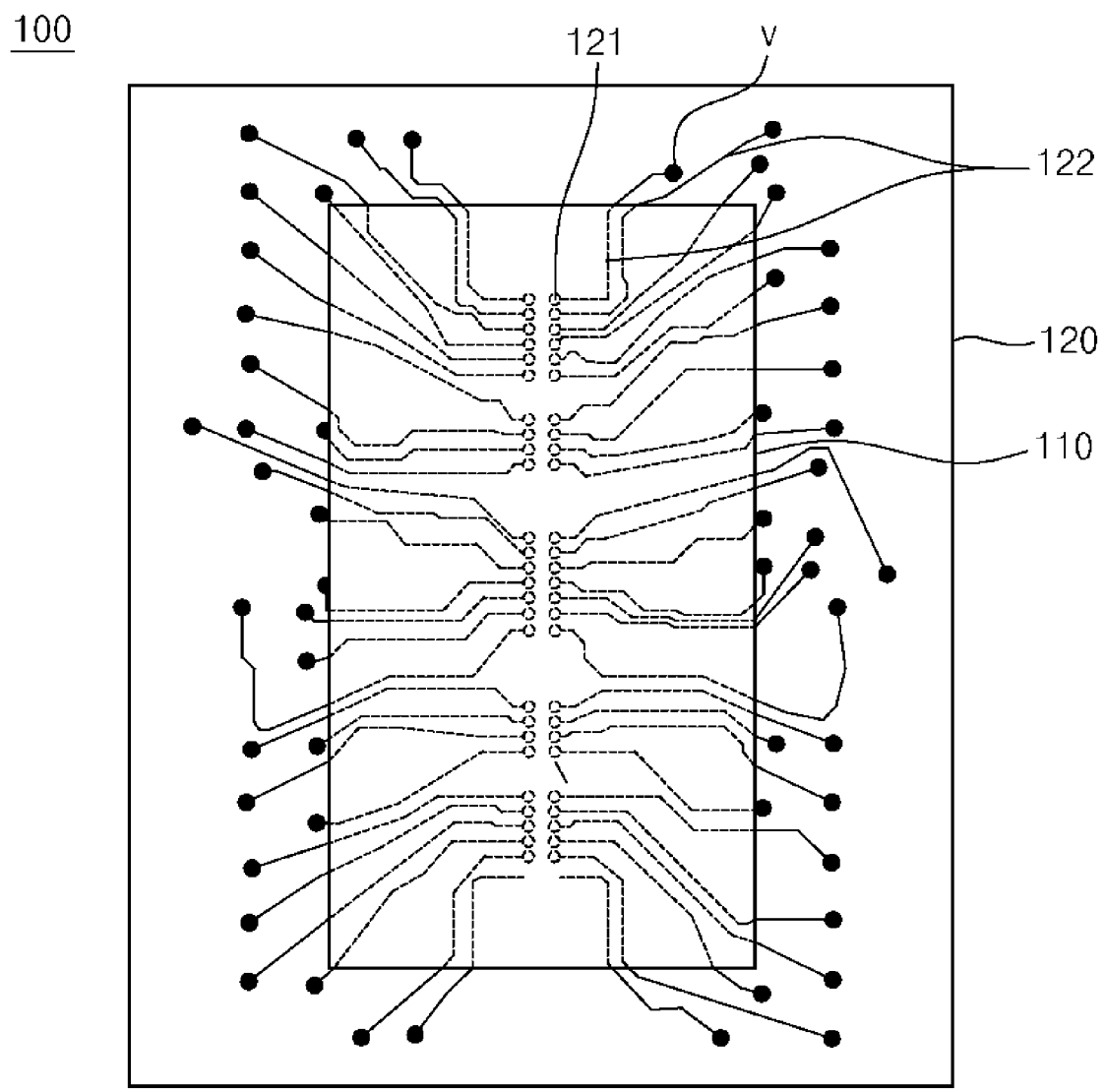
FIG. 1B is a plan view of the conventional flip-chip package other than a sealing member and a first solder resist.

Referring to FIGS. 1A and 1B, a conventional flip-chip package 100 has a structure in which a semiconductor chip 110 has been physically and electrically bonded to a substrate 120 by bumps 140. In such a flip-chip package 100, the substrate 120 may have a multi-layer wiring structure having at least two layers of insulating layers 120-1 and wires 122, 124 and 126 formed on the respective insulating layers 120-1. The substrate 120 has a top surface 120a, and may include an external signal line 122 formed on the top surface 120a, an internal signal line 124 formed therein, and an external electrode 126 formed on a bottom surface 120b.

The external signal line 122 may be extended from a portion of the substrate 120 overlapping the semiconductor chip 110 to a portion of the substrate 120 not overlapping the semiconductor chip 110. The external signal line 122 may include a bond finger 121 disposed at one end that overlaps the semiconductor chip 110. The bond finger 121 is electrically coupled to the bonding pad 112 of the semiconductor chip 110 through the bump 140.

In FIG. 1A, 132 designates a first solder resist, 134 designates a second solder resist, and 150 designates a sealing member. FIGS. 1A and 1B also illustrate a through via V coupling the external signal line 122 to the external electrode 126

Since the conventional flip-chip package is not shielded, electromagnetic waves generated in an operating process can affect an external device. More specifically, a portion of the external signal line disposed outside a region O/R overlapping the semiconductor chip 110 on the substrate 120 is exposed without shielding means. Accordingly, electromagnetic waves may be radiated from the portion, thereby affecting the external device. Furthermore, electromagnetic waves generated as described above may cause an electromagnetic interference to the external device, thus becoming a cause of a malfunction or a failure.

Embodiments of the present disclosure provide a semiconductor package capable of shielding electromagnetic waves generated therein.

Figure 2B:
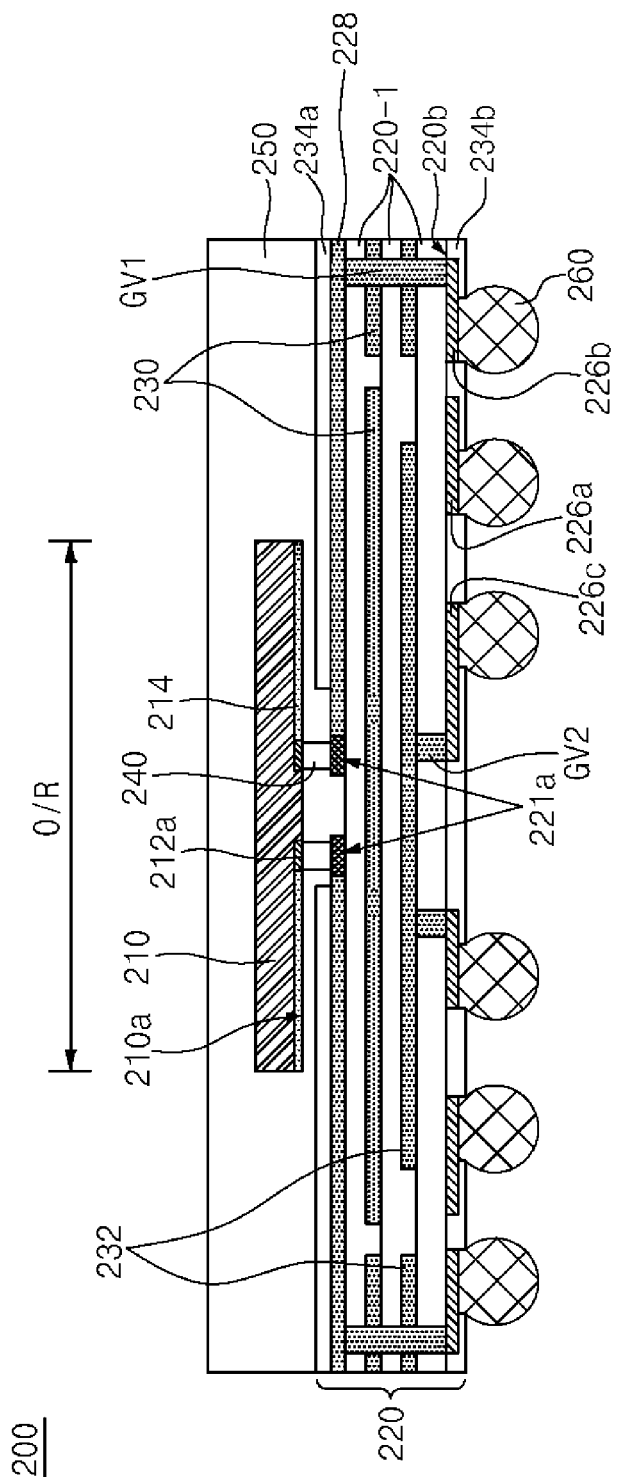
Figure 2C:
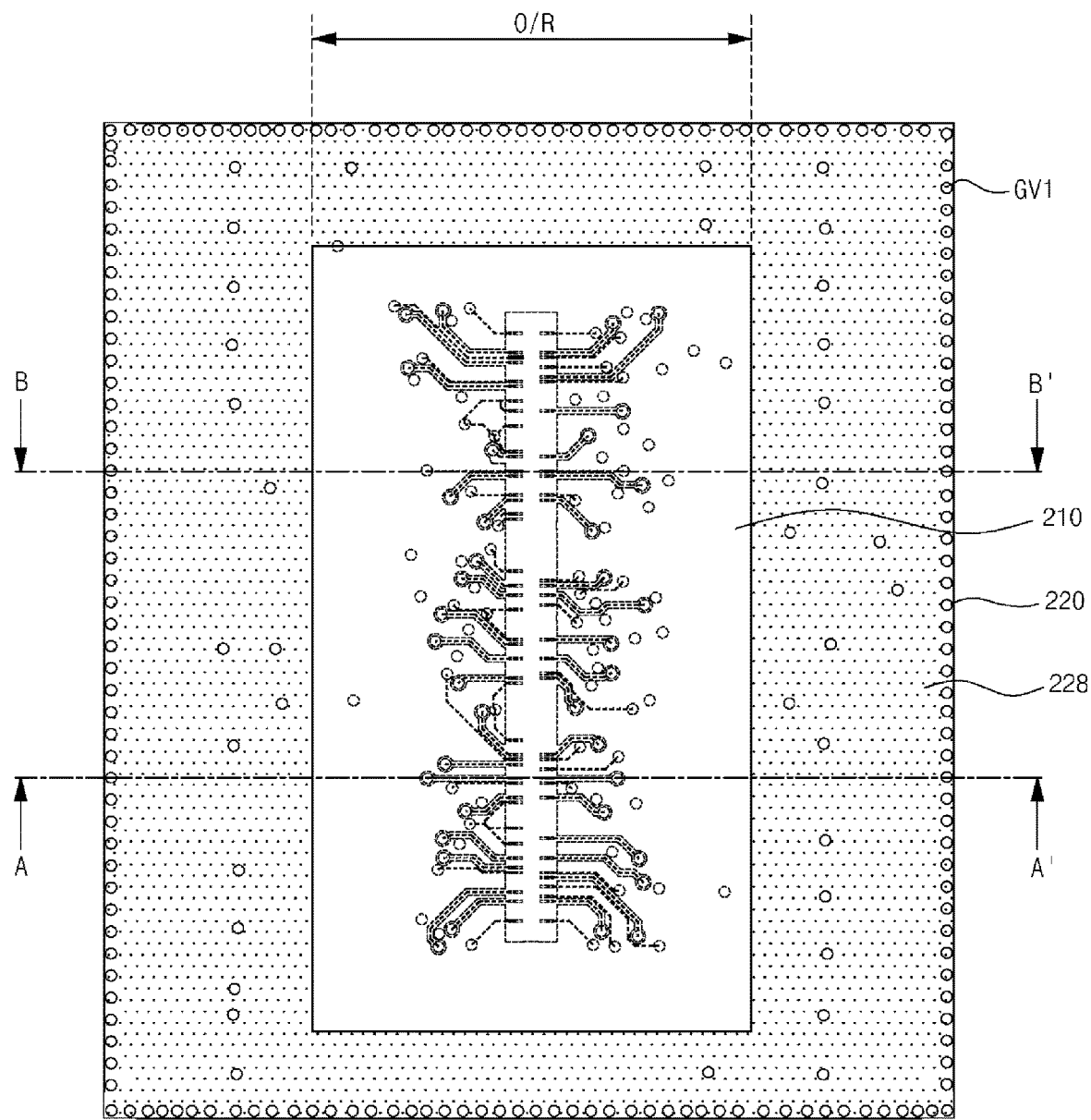
FIG. 2C is a plan view of the semiconductor package other than a sealing member and a first solder resist in accordance with an embodiment.

Referring to FIGS. 2A to 2C, a semiconductor package 200 in accordance with an embodiment may include a semiconductor chip 210 and a substrate 220. The semiconductor package 200 may further include bumps 240, a sealing member 250 and external coupling members 260.

The semiconductor chip 210 may be a memory chip. The semiconductor chip 210 may be a logic chip. The semiconductor chip 210 may have an active surface 210a and a backside 210b opposite the active surface 210a. The semiconductor chip 210 may include bonding pads 212 and ground bonding pads 212a arranged in the active surface 210a. Although not illustrated, the bonding pad 212 may be arranged at the central part of the active surface 210a in, for example, two columns.

The semiconductor chip 210 may include the bumps 240 formed on the bonding pad 212 and the ground bonding pad 212a. The bump 240 may be any one of a copper post bump, a solder bump and a bump on which several metals have been stacked. The semiconductor chip 210 may be disposed over the top surface 220a of the substrate 220 so that the active surface 210a faces the top surface 220a of the substrate 220. The bonding pad 212 of the semiconductor chip 210 and the bond finger 221 of the substrate 220 may be electrically coupled together by the bump 240. Furthermore, the ground bonding pad 212a of the semiconductor chip 210 and the ground bond finger 221a of the substrate 220 may also be electrically coupled together by the bump 240.

Referring to FIG. 2B, the semiconductor chip 210 may include a ground metal pattern 214 formed in the active surface 210a. The ground metal pattern 214 may be coupled to the ground bonding pad 212a. The ground metal pattern 214 may be electrically coupled to a first ground pattern 228 disposed in the substrate 220 through the ground bonding pad 212a and the bump 240.

The substrate 220 may be a printed circuit board. The substrate 220 may have a rectangle plate shape. The substrate 220 may have a multi-layer wiring structure including at least two layers of wire layers. That is, the substrate 220 may have a multi-layer wiring structure in which at least two layers of insulating layers 220-1 and wire layers including wires 222 and 224 or ground patterns 228, 230 and 232 are stacked. In an embodiment, the substrate 220 includes four layers of wire layers (i.e., Layer 1-4). The substrate 220 may have the top surface 220a and a bottom surface 220b opposite the top surface 220a.

The substrate 220 may include a bond finger 221 and aground bond finger 221a disposed on the top surface 220a. The substrate 220 may include an external signal line 222 and a first ground pattern 228 formed on the top surface 220a. The substrate 220 may include an internal signal line 224 and second and third ground patterns 230 and 232 formed therein. The substrate 220 may include a first external electrode 226a and second and third external electrodes 226b and 226c formed on the bottom surface 220b.

The substrate 220 may include a first signal via SV1 formed therein so that the external signal line 222 and the internal signal line 224 are coupled together. The substrate 220 may include a second signal via SV2 formed therein so that the internal signal line 224 and the first external electrode 226a are coupled together. The substrate 220 may include a first ground via GV1 formed therein so that the first, the second and the third ground patterns 228, 230 and 232 and the second external electrode 226b are coupled together. The substrate 220 may include a second ground via GV2 formed therein so that the third ground pattern 232 and the third external electrode 226c are coupled together.

Figure 3A:
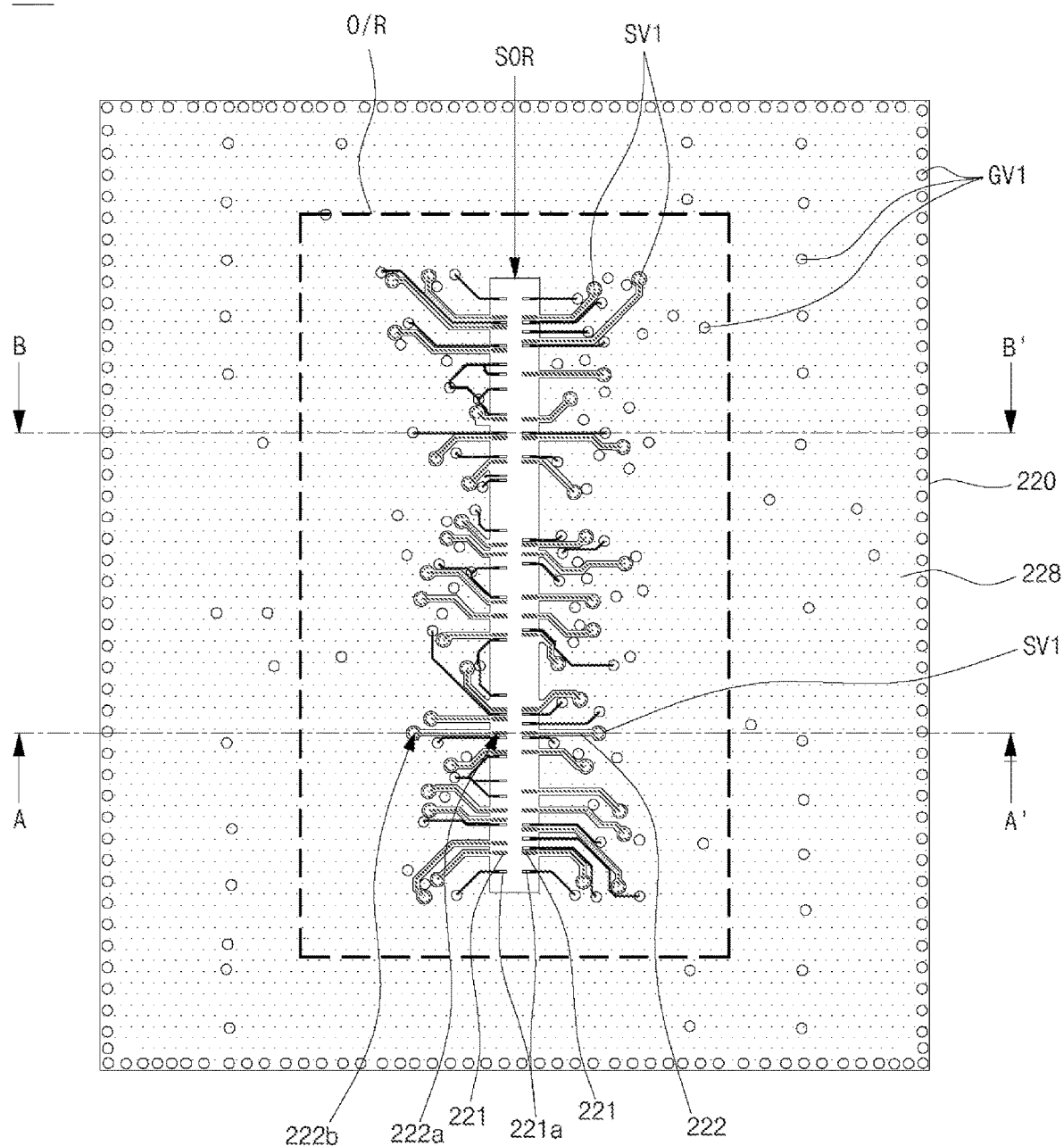
FIG. 3A is a plan view of the first layer of a substrate in the semiconductor package according to an embodiment other than the first solder resist.

A plurality of the bond fingers 221 and the ground bond fingers 221a may be disposed on the top surface 220a of the substrate 220. Each of the bond fingers 221 may be disposed to overlap the bonding pad 212 of the semiconductor chip 210. Each of the ground bond fingers 221a may be disposed to overlap the ground bonding pad 212a of the semiconductor chip 210. As illustrated in FIG. 3A, the bond fingers 221 may be arranged in two columns at the central part of the top surface 220a of the substrate 220. The bond finger 221 may be electrically coupled to the bonding pad 212 of the semiconductor chip 210 through the bump 240. The ground bond finger 221a may be electrically coupled to the ground bonding pad 212a of the semiconductor chip 210 through the bump 240.

The external signal line 222 may be disposed to overlap the semiconductor chip 210. The entire external signal line 222 may be disposed within an overlap region O/R where the semiconductor chip 210 overlaps with the substrate 220. The external signal line 222 may have a first one end 222a that comes into contact with the bond finger 221 and a first other end 222b that is opposite the first one end 222a.

Referring to FIGS. 2A and 2B along with FIG. 3A, a plurality of the external signal lines 222 may be formed in the top surface of the substrate 220. The external signal lines 222 may be disposed entirely within the overlap region O/R so that the external signal lines 222 overlap the semiconductor chip 210. The external signal line 222 may be extended toward the edge of the substrate 220 while coming into contact with the bond finger 221 within the overlap region O/R.

The first ground pattern 228 may be formed on the top surface 220a of the substrate 220. The first ground pattern 228 may be coupled to the ground bond finger 221a. The first ground pattern 228 may be extended from the overlap region O/R to the edge of the substrate 220. The first ground pattern 228 may be disposed on the top surface 220a of the substrate excluding the external signal line 222 and a solder resist open region SOR. As illustrated in FIG. 2B, the first ground pattern 228 may be electrically coupled to the ground metal pattern 214 through the ground bond finger 221a, the bump 240 and the ground bonding pad 212a. The ground metal pattern 214 may disposed on the active surface 210a of the semiconductor chip 210. The first ground pattern 228 may be electrically coupled to the second external electrode 226b through the first ground via GV1. The second external electrode 226b may be disposed on the bottom surface 220b of the substrate 220.

A first ground via GV1 may be formed within the substrate 220. The first ground via GV1 may electrically couple the first, the second and the third ground patterns 228, 230 and 232, and the second external electrode 226b. Thus, we have made amendments to the elemental lines of FIG. 2B for these elements. There may be a plurality of first ground vias GV1 within the substrate 220. A plurality of the first ground vias GV1, as illustrated in FIG. 3A, may be arranged in a loop shape around a perimeter of the substrate or in a loop shape at a predetermined distance away from the perimeter of the substrate. For example, in an embodiment, a plurality of first ground vias GV1 may be formed around the outside boarder of the substrate 220 to form a loop shape around the perimeter of the substrate 220. In an embodiment, for example, a plurality of first ground vias GV1 may be formed to form a loop shape around a predetermined distance away from the perimeter of the substrate 200. The first ground via GV1 may be formed to reach from the top surface 220a of the substrate 220 to the bottom surface 220b of the substrate 220. The plurality of first ground vias GV1 may be arranged in a loop shape and be spaced apart from one another but still essentially form a closed loop shape as illustrated in FIG. 3A. In some embodiments there may be, for example, one or more loops of first ground vias GV1. For example, in an embodiment, there may be a first loop of first ground vias GV1 located at a perimeter of the substrate 200 and a second loop of first ground vias GV1 located at a predetermined distance away from the perimeter of the substrate 220. The first ground vias GV1 may be arranged in the substrate 220 to form a partial loop or a plurality of partial loops around the perimeter of the substrate 220 or a predetermined distance away from the perimeter of the substrate 220. The plurality of first ground vias GV1 may be spaced apart from one another but still essentially forming a partial loop shape or closed curve along the perimeter of the substrate 220 or a predetermined distance away from the perimeter of the substrate 220. The plurality of first ground vias GV1 used to form a loop shape, closed loop shape, partial loop shape, or closed curve may be spaced apart from one another at a distance that may still prevent or minimize electromagnetic waves from radiating outside or past the loop shape, closed loop shape, partial loop shape, or closed curve and ultimately outside the substrate 220. Also, for example, the plurality of loop shape, closed loop shape, partial loop shape, or closed curve formed around a perimeter of the substrate 220 may prevent or minimize electromagnetic waves from radiating outside the edge of the substrate 220. Accordingly, the semiconductor package according to an embodiment can effectively reduce an influence on an external device because it has a structure (i.e., loop shape, closed loop shape, partial loop shape, or closed curve) for shielding electromagnetic waves generated from wire layers, that is, the external signal line 222 and the internal signal line 224. However, after reviewing your comments and from the perspective of FIG. 3A we believe we now understand what was meant by 'closed curve.' So we amended original paragraph 35 to define what is illustrated in FIG. 3A regarding the 'loop shape' of first ground via GV1 located at a perimeter of the substrate 220. We also accounted for variances in the loop structure for when a partial loop shape or closed curve is formed instead of a closed loop shape. We also accounted for multiple loop shapes and partial loop shapes located at the perimeter and away from the perimeter. We also defined the spacing between the first ground via GV1 of a loop shape or partial loop shape to be at a distance that may still prevent or minimize electromagnetic waves from radiating outside the loop shape or partial loop shape and ultimately outside the substrate 220. By doing this we didn't have to say how close the GV1 need to be to one another, just that their spacing needs to minimize or prevent electromagnetic waves from radiating outside the loop shape or partial loop shape and ultimately outside the substrate 220. As a result new dependent claims 17 and 18 and 10 and 11 were added to provide for a plurality of first ground via and their positioning.

The internal signal line 224 may be disposed in a layer under a layer with the external signal line 222 in the substrate 220. The substrate has a multi-layer wiring structure. In an embodiment, the substrate 220 includes four wire layers, and the internal signal line 224 may be disposed in a layer, e.g., a second layer, under a first layer in which the external signal line is disposed. The internal signal line 224 may include a second one end 224*a* and a second other end 224*b* opposite the second one end 224*a*. The second one end 224*a* may be disposed within the overlap region O/R. The second one end 224*a* may be disposed to overlap the first other end 222*b* of the external signal line 222. The internal signal line 224 may be overlapped with the first ground pattern 228. The internal signal line 224 may be disposed in the overlap region O/R. The internal signal line 224 may be disposed in a region where the overlap region O/R overlaps the first ground pattern 228. The internal signal line 224 may be disposed to overlap the first ground pattern 228 outside of the overlap region O/R. In an embodiment, for example, the internal signal line 224 may only be located within the overlap region O/R and outside of any region overlapping with the first ground pattern 228, within a region overlapping with the first ground pattern 228 in an area outside the overlap region O/R, within a region overlapping with where the first ground pattern 228 overlaps with the overlap region O/R and nowhere else, or within an area or region overlapping with any combination thereof. In an embodiment, for example, the internal signal line 224 may only be located within the overlap region O/R such that no portion of the internal signal line 224 extends beyond the overlap region O/R and no portion of the internal signal line 224 is overlapped by the first ground pattern 228. In an embodiment, for example, the internal signal line 224 may only be located in a region overlapping with the first ground pattern 228 outside the overlap region O/R. In an embodiment, for example, the internal signal line 224 may only be located within a region overlapping with where both the overlap region O/R and the first ground pattern 228 overlap with each other and nowhere else. In an embodiment, for example, the internal signal line 224 may only be located within the overlap region O/R and outside any region overlapping with the first ground pattern 228 within the overlap region O/R, within a region that overlaps with the first ground pattern 228 outside the overlap region O/R, and within a region overlapping with where both the overlap region O/R and the first ground pattern 228 overlap with each other. In an embodiment, for example, the internal signal line 224 may only be located within a region overlapping with where both the overlap region O/R and the first ground pattern 228 overlap with each other, and a region within the overlap region O/R outside of any region overlapping with the first ground pattern 228 within the overlap region O/R. In an embodiment, for example, the internal signal line 224 may only be located within a region overlapping with where both the overlap region O/R and the first ground pattern 228 overlap with each other, and within a region overlapping with the first ground pattern 228 outside the overlap region O/R.

The first signal via SV1 may be disposed between the first other end 222*b* of the external signal line 222 and the second one end 224*a* of the internal signal line 224. The first signal via SV1 may have a top surface come into contact with the first other end 222*b* of the external signal line 222, and may have a bottom surface come into contact with the second one end 224*a* of the internal signal line 224. Accordingly, the external signal line 222 and the internal signal line 224 may be electrically coupled together through the first signal via SV1.

A plurality of the internal signal lines 224 may be formed so that they correspond to a plurality of the external signal lines 222, respectively. The internal signal line 224 may be disposed to extend from the overlap region O/R to the outside of the overlap region O/R. Alternatively, the internal signal line 224 may be disposed only within the overlap region O/R.

The second ground pattern 230 may be disposed in the substrate 220. The second ground pattern 230 may be disposed in a layer with the internal signal line 224. In an embodiment, the substrate 220 includes four wire layers. The second ground pattern 230 may be disposed in the same layer, e.g., the second layer, as the layer in which the internal signal line 224 is disposed.

Figure 3B:
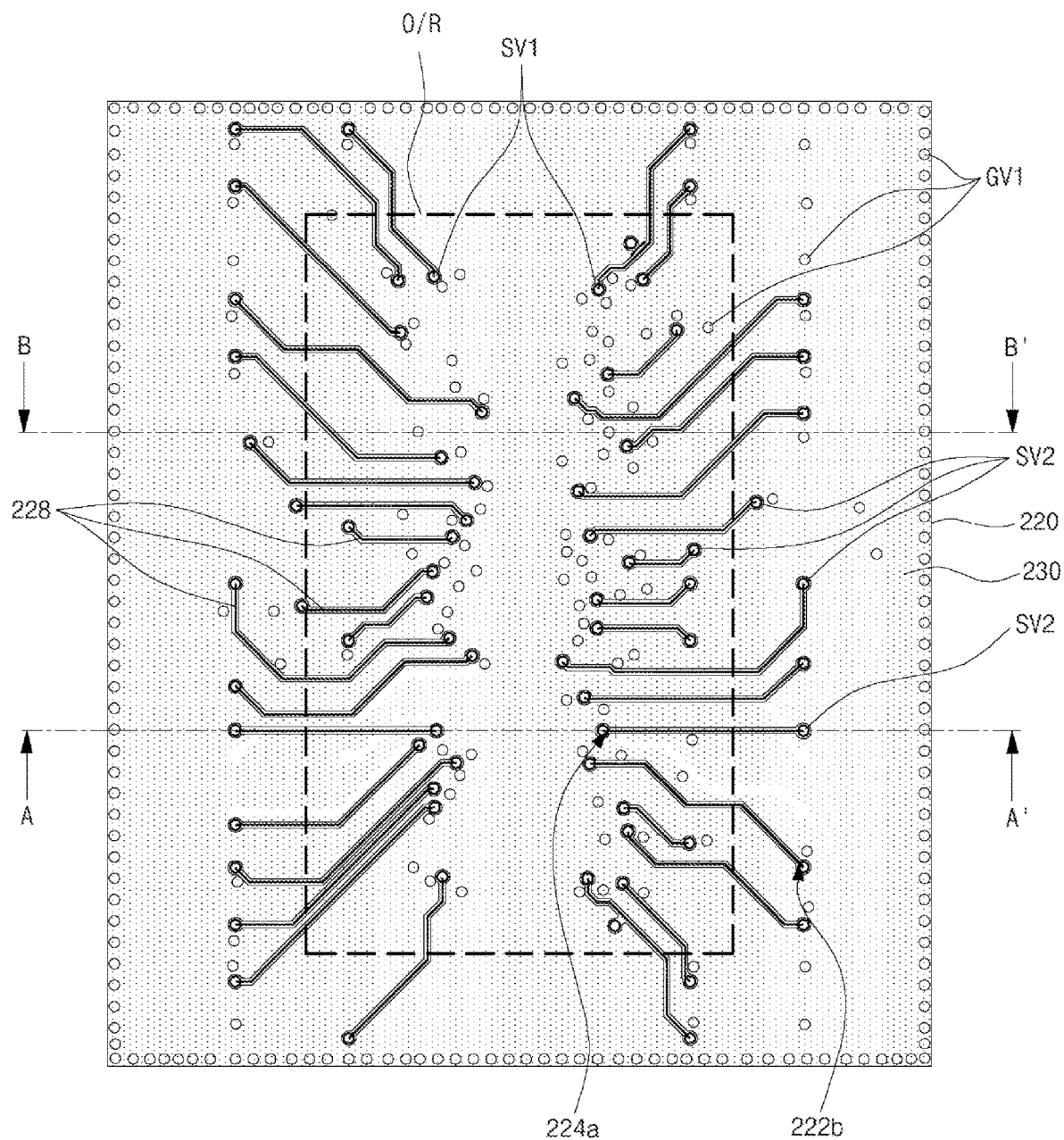
FIG. 3B is a plan view of the second layer of the substrate in the semiconductor package according to an embodiment.

Referring to FIGS. 2A and 2B along with FIG. 3B, the second ground pattern 230 may be disposed in the remaining portions other than the portion where the internal signal line 224 is disposed.

The third ground pattern 232 may be disposed in the substrate 220. The third ground pattern 232 may be disposed in a layer under the layer with the internal signal line 224. The third ground pattern 232 may be disposed in a layer between a layer with the internal signal line 224 and a layer with the first to third external electrodes 226*a*, 226*b* and 226*c*. In an embodiment, the substrate 220 includes four wire layers. The third ground pattern 232 may be disposed in the third layer. The second layer may include the internal signal line 224, and the fourth layer may include the first to third external electrodes 226*a*, 226*b* and 226*c*. The third ground pattern 232 may be disposed to overlap the internal signal line 224.

Figure 3C:
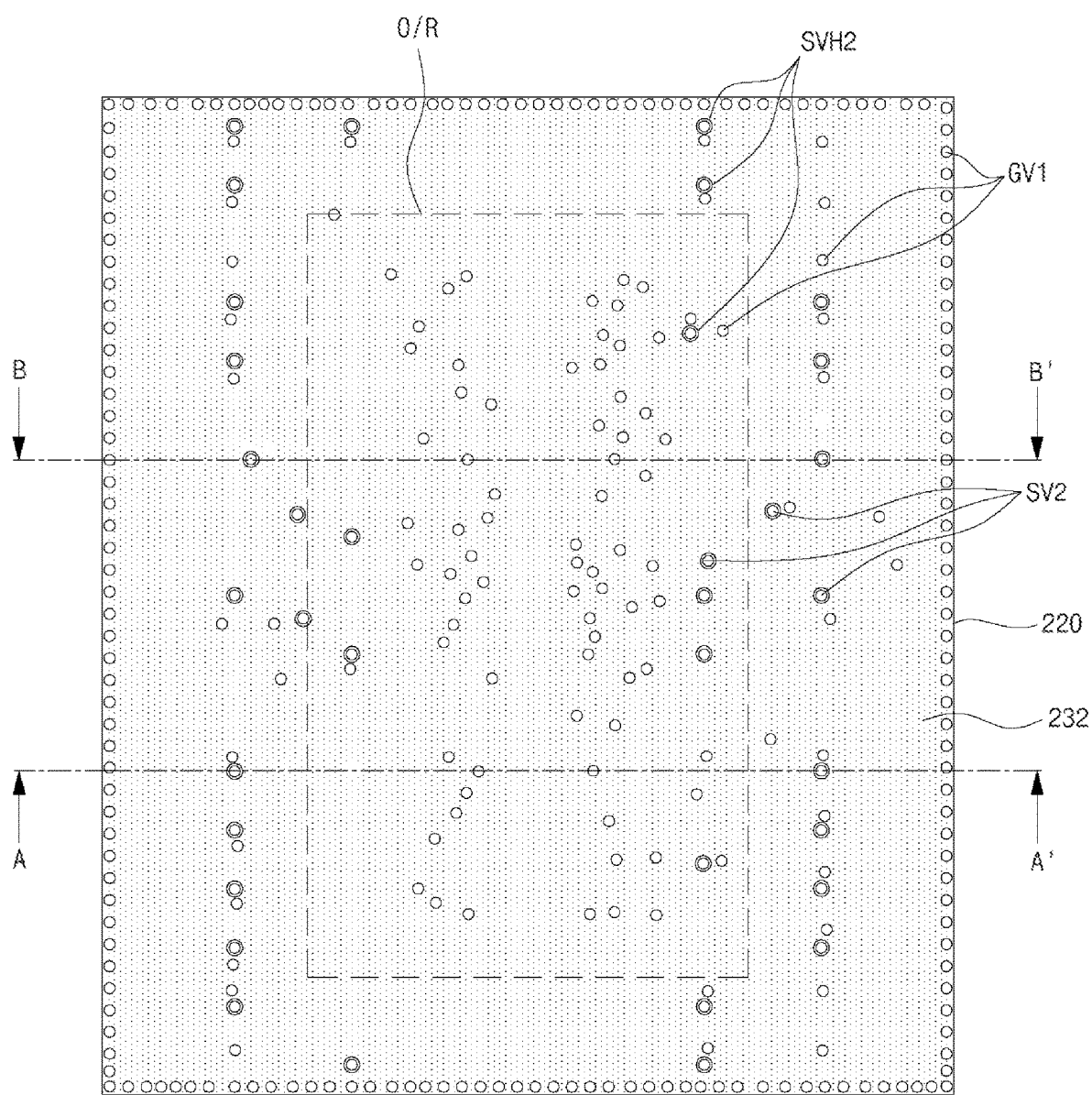
FIG. 3C is a plan view of the third layer of the substrate in the semiconductor package according to an embodiment.

Referring to FIGS. 2A and 2B along with FIG. 3C, the ground pattern 232 may be disposed in the remaining portions other than the portion where the first ground via GV1 and the second signal via SV2 are disposed.

In FIG. 3C, SVH2 designates a hole in which the second signal via is formed.

The first external electrode 226*a*, the second external electrode 226*b* and the third external electrode 226*c* may be disposed on the bottom surface 220*b* of the substrate 220. The first external electrode 226*a* may be electrically coupled to the second signal via SV2. The second external electrode 226*b* may be electrically coupled to the first ground via GV1. Accordingly, the first ground pattern 228 disposed on the top surface 220*a* of the substrate 220 and the second external electrode 226*b* disposed on the bottom surface 220*b* of the substrate 220 may be electrically coupled together by the first ground via GV1. The third external electrode 226*c* may be electrically coupled to the second ground via GV2.

The second signal via SV2 may be formed to couple the first external electrode 226*a* and the second other end 224*b* of the internal signal line 224 within the substrate 220. The second signal via SV2 may be overlapped the second other end 224*b* of the internal signal line 224. The second signal via SV2 may be disposed at a location not overlapping the semiconductor chip 210, that is, outside the overlap region O/R. The second signal via SV2 may have a top surface coupled to the second other end 224*b* of the internal signal line 224 and a bottom surface coupled to the first external electrode 226*a*. Accordingly, the internal signal line 224 and the first external electrode 226*a* may be electrically coupled together through the second signal via SV2.

The second ground via GV2 may be formed to couple the third ground pattern 232 and the third external electrode 226*c* within the substrate 220. The second ground via GV2 may have a top surface coupled to the third ground pattern 232 and a bottom surface coupled to the third external electrode 226*c*. Accordingly, the third ground pattern 232 may be electrically coupled to the third external electrode 226*c* through the second ground via GV2.

The substrate 220 may further include a first solder resist 234a formed to expose the bond finger 221 on the top surface 220a thereof. The substrate 220 may further include a second solder resist 234b formed to expose the first to third external electrodes 226a, 226b and 226c on the bottom surface 220b thereof.

The sealing member 250 may be formed to protect the semiconductor chip 210 from the outside. The sealing member 250 may be formed to cover the semiconductor chip 210 over the top surface 220a of the substrate 220 including the first solder resist 234a. The sealing member 250 may be formed to fill the space between the semiconductor chip 210 and the substrate 220. The sealing member 250 may be made of an epoxy molding compound.

In other embodiments, the space between the semiconductor chip 210 and the substrate 220 may be filled with an underfill material.

The external coupling member 260 may be means for mounting the semiconductor package 200 in accordance with an embodiment on an external circuit. The external coupling member 260 may be formed on each of the first to third external electrodes 226a, 226b and 226c exposed from the second solder resist 234 in the bottom surface 220b of the substrate 220. The external coupling member 260 may include a solder ball. The external coupling member 260 may include a conductive pin or a conductive paste.

The semiconductor package according to an embodiment has a structure in which all of the external signal line disposed on the top surface of the substrate overlap the semiconductor chip. The semiconductor package according to an embodiment has a structure in which the internal signal line is surrounded by the semiconductor chip and the first to third ground patterns. The semiconductor package according to an embodiment has a structure in which the first ground pattern of the substrate is electrically coupled to the ground metal pattern of the semiconductor chip.

Accordingly, when the semiconductor package according to an embodiment operates, electromagnetic waves radiated from the external signal line to the upper side of the substrate may not be radiated outside the package because they are scattered through reflection and diffraction by the ground metal pattern of the semiconductor chip. Furthermore, electromagnetic waves radiated from the internal signal line to the upper and lower sides of the substrate may not be radiated outside the package because they are shielded by the semiconductor chip and the first to third ground patterns.

Therefore, the semiconductor package according to an embodiment can effectively reduce an influence on an external device because it has a structure for shielding electromagnetic waves radiated from wire layers, that is, the external signal line and the internal signal line.

Figure 4A:
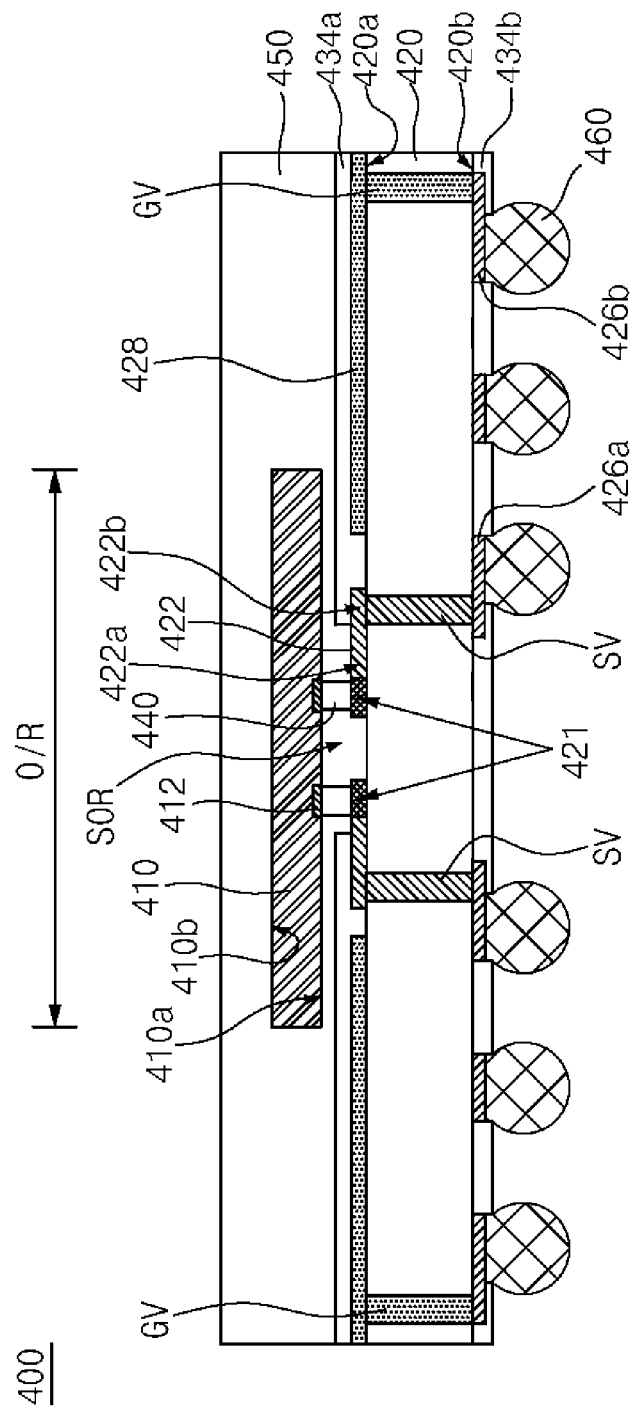
FIGS. 4A and 4B are cross-sectional views illustrating a semiconductor package according to an embodiment.
Figure 4B:
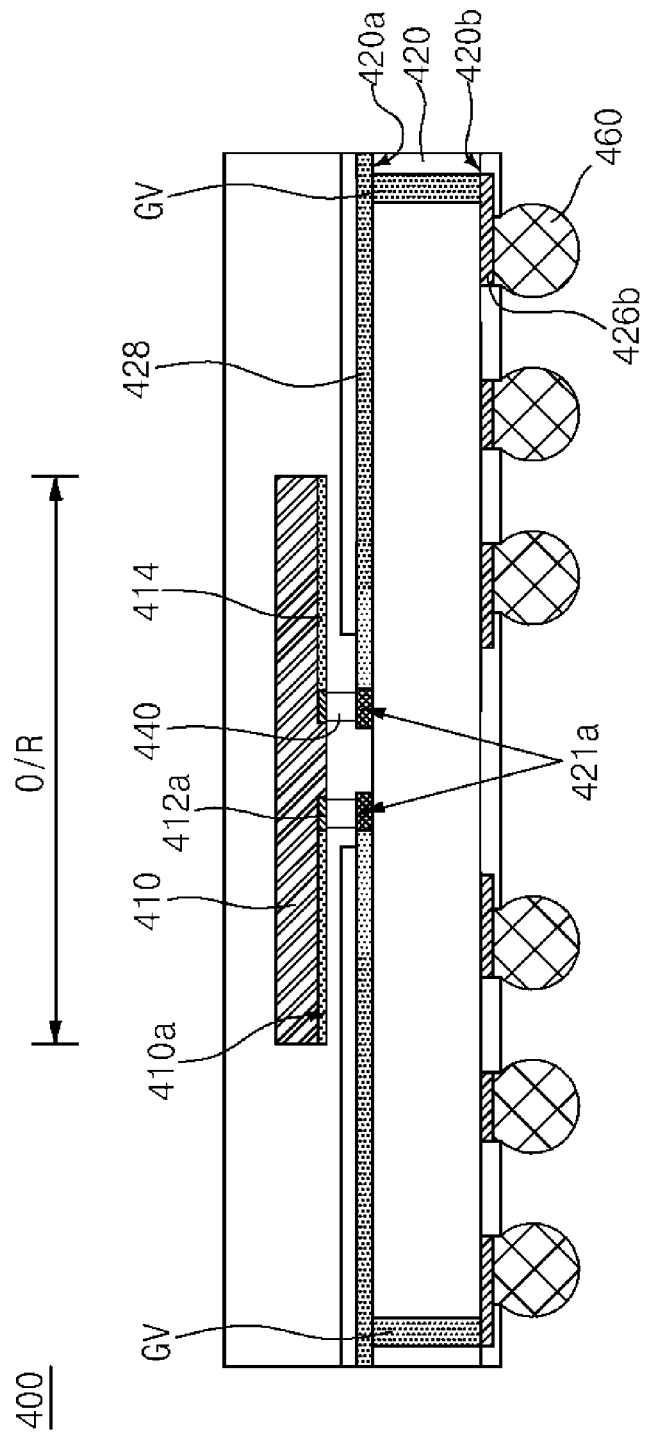

Referring to FIGS. 4A and 4b, a semiconductor package 400 according to an embodiment may include a semiconductor chip 410, a substrate 420, bumps 440, a sealing member 450 and external coupling members 460.

The semiconductor chip 410 may be a memory chip or a logic chip. The semiconductor chip 410 may include an active surface 410a and a backside 410b. The semiconductor chip 410 may include bonding pads 412 arranged in the active surface 410a. The semiconductor chip 410 may include the bumps 440 formed on the bonding pad 412. The bump 440 may be any one of a copper post bump, a solder bump and a bump on which several metals have been stacked. The semiconductor chip 410 may be disposed over the top surface 420a of the substrate 420 so that the active surface 410a of the semiconductor chip 410 faces the top surface 420a of the substrate 420. The bonding pad 412 of the semiconductor chip 410 and the bond finger 421 of the substrate 420 may be electrically coupled together by the bump 440.

The semiconductor chip 410 may include ground bonding pads 412a arranged on the active surface 410a. The semiconductor chip 410 may include a ground metal pattern 414 formed in the active surface 410a and coupled to the ground bonding pads 412a. The ground bonding pad 412a may be electrically coupled to a ground bond finger 421a of the substrate 420 through the bump 440.

The substrate 420 may be a printed circuit board. The substrate 420 may substantially have a rectangle plate shape. The substrate 420 may include the top surface 420a and a bottom surface 420b opposite the top surface 420a.

The substrate 420 may have the bond finger 421 disposed on the top surface 420a so that the bond finger 421 overlaps the bonding pad 412 of the semiconductor chip 410. The substrate 420 may include the ground bond finger 421a disposed to overlap the ground bonding pad 412a of the semiconductor chip 410. The substrate 420 may include an external signal line 422 and the ground pattern 428 disposed on the top surface 420a. The substrate 420 may include a first external electrode 426a and a second external electrode 426b disposed on the bottom surface 420b. The substrate 420 may include a signal via SV formed therein so that the external signal line 422 and the first external electrode 426a are coupled together. The substrate 420 may include a ground via GV formed therein so that the ground pattern 428 and the second external electrode 426b are coupled together.

A plurality of the bond fingers 421 and the ground bond fingers 421a may be disposed on the top surface 420a of the substrate 420. Each of the bond fingers 421 may overlap the bonding pad 412 of the semiconductor chip 410. Each of the ground bond fingers 421a may overlap the ground bonding pad 412a of the semiconductor chip 410. The bond finger 421 and the ground bond finger 421a may be disposed within the overlap region O/R where the semiconductor chip 410 overlaps the substrate 420. The bond finger 421 may be electrically coupled to the bonding pad 412 of the semiconductor chip 410 through the bump 440. The ground bond finger 421a may be electrically coupled to the ground bonding pad 412a of the semiconductor chip 410 through the bump 440.

A plurality of the external signal lines 422 may be disposed on the top surface 420a of the substrate 420. The external signal lines 422 may be disposed to overlap the semiconductor chip 410. The entire external signal lines 422 may be disposed within an overlap region O/R. The external signal line 422 may include one end 422a that comes into contact with the bond finger 421 and the other end 422b that is opposite the one end 422a. The external signal line 422 may be extended toward the edge of the substrate 420 while coming into contact with the bond finger 421 in the overlap region O/R.

The ground pattern 428 may be formed on the top surface 420a of the substrate 420. The ground pattern 428 may be disposed to extend from the overlap region O/R to the edge of the substrate 420. The ground pattern 428 may be disposed on the top surface 420a of the substrate 420 excluding the external signal line 422 and a solder resist open region SOR. The ground pattern 428 may be coupled to the ground bond finger 421a. The ground pattern 428 may be electrically coupled to the ground metal pattern 414 of the semiconductor chip 410 through the ground bond finger 421a, the bump 440 and the ground bonding pad 412a. The ground pattern 428 may be electrically coupled to the second external electrode 426b through the ground via GV. The second external electrode 426b may be disposed on the bottom surface 420b of the substrate 420.

The first external electrode 426a and the second external electrode 426b may be disposed on the bottom surface 420b of the substrate 420. The first external electrode 426a may be electrically coupled to the external signal line 422 through the signal via SV. The second external electrode 426b may be electrically coupled to the ground pattern 428 through the ground via GV.

The signal via SV may be disposed to overlap the other end 422b of the external signal line 422. The signal via SV may have a top surface coupled to the other end 422b of the external signal line 422 and a bottom surface coupled to the first external electrode 426a. Accordingly, the external signal line 422 and the first external electrode 426a may be electrically coupled together through the signal via SV. The signal via SV may be disposed within the overlap region O/R.

A ground via GV may be formed within the substrate 420. The ground via GV may electrically couple the ground pattern 428 disposed on the top surface 420a of the substrate 420 and the second external electrode 426b disposed on the bottom surface 420b of the substrate 420. There may be a plurality of ground via GV within the substrate 420. A plurality of the ground via GV may be arranged in a loop shape around a perimeter of the substrate or in a loop shape at a predetermined distance away from the perimeter of the substrate. For example, in an embodiment, a plurality of ground vias GV may be formed around the outside boarder of the substrate 420 to form a loop shape around the perimeter of the substrate 420. In an embodiment, for example, a plurality of ground via GV may be formed to form a loop shape around a predetermined distance away from the perimeter of the substrate 400. The ground via GV may have a top surface coupled to the ground pattern 428 disposed on the top surface 420a of the substrate 420 and a bottom surface coupled to the second external electrode 426b disposed on the bottom surface 420b of the substrate 420. Accordingly, the ground pattern 428 and the second external electrode 426b may be electrically coupled together through the ground via GV.

The substrate 420 may further include a first solder resist 434a formed to expose the bond finger 421 and the ground bond finger 421a on the top surface 420a. The substrate 420 may further include a second solder resist 434b formed to expose the first and the second external electrodes 426a and 426b on the bottom surface 420b.

The sealing member 450 may be formed to protect the semiconductor chip 410 from the outside. The sealing member 450 may be formed to cover the semiconductor chip 410 over the top surface 420a of the substrate 420 including the first solder resist 434a. The sealing member 450 may be formed to fill the space between the semiconductor chip 410 and the substrate 420. The sealing member 450 may be made of an epoxy molding compound.

The external coupling member 460 may be formed on each of the first and the second external electrodes 426a and 426b exposed from the second solder resist 434b on the bottom surface 420b of the substrate 420. The external coupling member 460 may include a solder ball. The external coupling member 460 may include a conductive pin or a conductive paste.

The semiconductor package according to an embodiment may have a structure in which the external signal line overlaps the semiconductor chip and the ground pattern is formed on the top surface of the substrate. The semiconductor package according to an embodiment may have a structure in which the ground pattern of the substrate is electrically coupled to the ground metal pattern of the semiconductor chip. Accordingly, when the semiconductor package according to an embodiment operates, electromagnetic waves generated from the external signal line to the upper side of the substrate may not be radiated outside the package because they are scattered through diffraction by the ground metal pattern of the semiconductor chip. Furthermore, electromagnetic waves generated by the external signal line may not be radiated outside the package because they are shielded by the ground pattern of the substrate. Therefore, electromagnetic waves generated within the semiconductor package may not hinder the function of an external device because they are shielded.

The semiconductor packages in accordance with the above-described various embodiments may be applied to various kinds of electronic systems and memory cards.

Figure 5:
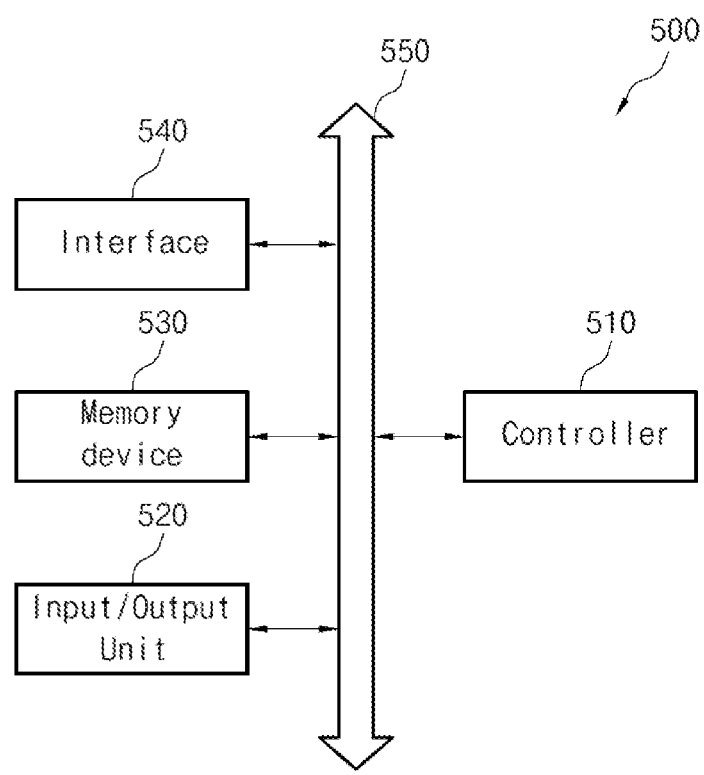
FIG. 5 is a block diagram illustrating a representation of an example of an electronic system to which the semiconductor packages in accordance with the various embodiments may be applied.

Referring to FIG. 5, an electronic system 500 may include the semiconductor packages according to the above-described various embodiments. The electronic system 500 may include a controller 510, an input and output (input/output) unit 520, and a memory device 530. The controller 510, the input/output unit 520 and the memory device 530 may be coupled with one another through a bus 550 which provides data movement paths.

For example, the controller 510 may include at least any one of a microprocessor, a digital signal processor, a microcontroller, and logic devices capable of performing similar functions to these components. The controller 510 and the memory device 530 may include the semiconductor packages in accordance with the above-described various embodiments. The input/output unit 520 may include any one selected among a keypad, a keyboard, a display device, and so forth.

The memory device 530 may store data and/or commands to be executed by the controller 510. The memory device 530 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 500 may stably store a large amount of data in a flash memory system.

Such an electronic system 500 may further include an interface 540 for transmitting data to a communication network or receiving data from a communication network. The interface 540 may be a wired or wireless type. For example, the interface 540 may include an antenna or a wired/wireless transceiver.

Although not illustrated, the electronic system 500 may further include an application chipset, a camera image processor (CIP), and so forth.

The electronic system 500 may be realized as a mobile system, a personal computer, a computer for an industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the case where the electronic system 500 is equipment capable of performing wireless communication, the electronic system 500 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 6:
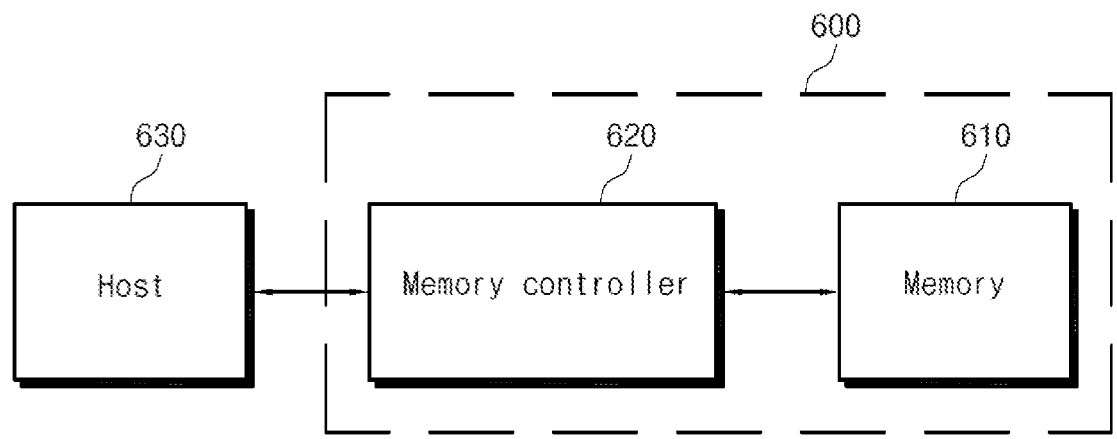
FIG. 6 is a block diagram illustrating a representation of an example of a memory card which may include the semiconductor packages in accordance with the various embodiments.

Referring to FIG. 6, a memory card may include the semiconductor packages according to the above-described various embodiments. For instance, a memory card 600 may include a memory 610 such as a nonvolatile memory device and a memory controller 620. The memory 610 and the memory controller 620 may store data or read stored data. The memory 610 may include at least any one among nonvolatile memory devices to which the semiconductor packages in accordance with the above-described various embodiments are applied. The memory controller 620 may control the memory 610 to read stored data or store data, in response to a read and write (read/write) request from a host 630.

Although various embodiments have been described for illustrative purposes, it will be apparent to those skilled in the art that various changes and modifications may be made without departing from the spirit and scope of the disclosure as defined in the following claims.

What is claimed is:

1. A semiconductor package, comprising:
a substrate having a bond finger and a ground bond finger disposed over a top surface of the substrate; and
a semiconductor chip mounted over the top surface of the substrate such that an active surface of the semiconductor chip faces the top surface of the substrate,
wherein the semiconductor chip comprises:
a bonding pad disposed over the active surface and electrically coupled to the bond finger,
a ground bonding pad electrically coupled to the ground bond finger, and
a ground metal pattern to which the ground bonding pad is coupled,
the substrate comprising:
an external signal line disposed over the top surface of the substrate overlapping the semiconductor chip and having one end coupled to the bond finger;
a ground pattern disposed over the top surface of the substrate, extended from an overlap region where the semiconductor chip overlaps with the substrate to an edge of the substrate, and to which the ground bond finger is coupled;
a signal via formed within the substrate and electrically coupled to the external signal line; and
a ground via formed within the substrate and electrically coupled to the ground pattern;
a first external electrode disposed over a bottom surface of the substrate and electrically coupled to the signal via; and
a second external electrode disposed over the bottom surface of the substrate and electrically coupled to the ground via, and
the bond finger is disposed to overlap the semiconductor chip, wherein the semiconductor chip comprises bumps formed over the bonding pad and the ground bonding pad to couple the bonding pad and the bond finger and to couple the ground bonding pad and the ground bond finger.

2. The semiconductor package of claim 1, wherein an entire external signal line overlaps with the semiconductor chip.

3. The semiconductor package of claim 1, further comprising:
a first solder resist formed over the top surface of the substrate to expose the bond finger and the ground bond finger;
a second solder resist formed over the bottom surface of the substrate to expose the first and the second external electrodes;
a sealing member formed over the top surface of the substrate comprising the first solder resist in such a way as to cover the semiconductor chip; and
an external coupling member formed over the first and the second external electrodes.

4. The semiconductor package of claim 1, wherein there is a plurality of the ground via, the plurality of ground via configured to minimize a number of electromagnetic waves generated from the external signal line from radiating outside the substrate.

5. The semiconductor package of claim 4, wherein the plurality of ground via are located at a perimeter of the substrate.

6. The semiconductor package of claim 5, wherein the plurality of ground via are arranged in a loop shape around the perimeter of the substrate.

7. The semiconductor package of claim 4, wherein the plurality of ground via are located at a predetermined distance away from the perimeter of the substrate.

8. The semiconductor package of claim 7, wherein the plurality of ground via are arranged in a loop shape at the predetermined distance away from the perimeter of the substrate.

9. The semiconductor package of claim 1, wherein the signal via is disposed inside of the overlap region.

* * * * *

UNITED STATES PATENT AND TRADEMARK OFFICE
CERTIFICATE OF CORRECTION

PATENT NO. : 10,615,129 B2
APPLICATION NO. : 16/186305
DATED : April 7, 2020
INVENTOR(S) : Won Duck Jung, Sang Joon Lim and Sung Mook Lim It is certified that error appears in the above-identified patent and that said Letters Patent is hereby corrected as shown below:

In the Claims

Please replace Claim 1 with the following:

1. A semiconductor package, comprising:
a substrate having a bond finger and a ground bond finger disposed over a top surface of the substrate; and a semiconductor chip mounted over the top surface of the substrate such that an active surface of the semiconductor chip faces the top surface of the substrate,
wherein the semiconductor chip comprises:
a bonding pad disposed over the active surface and electrically coupled to the bond finger, a ground bonding pad electrically coupled to the ground bond finger, and a ground metal pattern to which the ground bonding pad is coupled, the substrate comprising:
an external signal line disposed over the top surface of the substrate overlapping the semiconductor chip and having one end coupled to the bond finger; a ground pattern disposed over the top surface of the substrate, extended from an overlap region where the semiconductor chip overlaps with the substrate to an edge of the substrate, and to which the ground bond finger is coupled; a signal via formed within the substrate and electrically coupled to the external signal line; and a ground via formed within the substrate and electrically coupled to the ground pattern; a first external electrode disposed over a bottom surface of the substrate and electrically coupled to the signal via; and a second external electrode disposed over the bottom surface of the substrate and electrically coupled to the ground via, and the bond finger is disposed to overlap the semiconductor chip,
wherein the semiconductor chip comprises bumps formed over the bonding pad and the ground bonding pad to couple the bonding pad and the bond finger and to couple the ground bonding pad and the ground bond finger.

Signed and Sealed this
Eighth Day of October, 2024

*Katherine Kelly Vidal*

Katherine Kelly Vidal
*Director of the United States Patent and Trademark Office*